United States Patent [19]
Sung et al.

[11] Patent Number: 6,040,998
[45] Date of Patent: Mar. 21, 2000

[54] MEMORY ACTIVATION DEVICES AND METHODS

[75] Inventors: Chih-Ta Star Sung, Princeton, N.J.; Venkat Mattela, San Jose, Calif.; Muhammad Afsar, San Diego, Calif.; Balraj Singh; Chih-Teng Hung, both of San Jose, Calif.

[73] Assignee: Siemens Aktiengesellschaft, Munich, Germany

[21] Appl. No.: 09/132,559

[22] Filed: Aug. 11, 1998

[51] Int. Cl.[7] ................................ G11C 7/00; G11C 8/00
[52] U.S. Cl. ...................................... 365/194; 365/230.06
[58] Field of Search ............................ 365/194, 189.02, 365/189.05, 189.08, 230.02, 230.06, 230.08

[56] References Cited

U.S. PATENT DOCUMENTS

| | | | |
|---|---|---|---|
| 4,425,633 | 1/1984 | Swain | 365/194 |
| 5,500,818 | 3/1996 | Chang et al. | 365/194 |
| 5,530,677 | 6/1996 | Grover et al. | 365/194 |
| 5,652,732 | 7/1997 | Shah | 365/194 |
| 5,835,421 | 11/1998 | Pham et al. | 365/189.02 |
| 5,844,857 | 12/1998 | Son et al. | 365/194 |

*Primary Examiner*—Trong Phan

[57] ABSTRACT

An apparatus and method are disclosed for activating a memory location within a memory device. In an apparatus aspect of the invention, a memory device is disclosed. The memory device includes an enable unit arranged to receive a plurality of address signals and a clock signal and to output an activation signal. The address signals has an associated worst case delay, and the enable unit is further arranged to generate an enable signal that is delayed from the clock signal by at least about the worst case delay. The memory device further includes a memory array arranged to receive the activation signal in response to which a corresponding memory location is activated.

21 Claims, 7 Drawing Sheets

MEMORY ACTIVATION DEVICES AND METHODS

BACKGROUND OF THE INVENTION

The present invention relates generally to memory devices. More specifically, the present invention relates to method and apparatus for activating such memory devices.

FIG. 1A is a diagrammatic representation of a conventional memory device 100. As shown, the memory device 100 is configured to receive a plurality of address (ADR) signals, a clock signal (CLK), and a combined read and write enable (WR!/RD) signal. An "!" denotes that a write operation is enabled when the WR!/RD signal has a low value, while a high value enables a read operation. The memory device is also coupled with a databus (DB) that is used for receiving and outputting data into and out of the memory device 100.

Conventional memory devices typically include a memory array for storing data and a decoder for receiving the plurality of address signals and activating a particular memory location within the memory array that is associated with the address signals. The WR!/RD input signal indicates whether data is being retrieved from or input to the specified memory location of the memory array. Additionally, the memory device 100 uses the CLK signal to enable activation of the specified memory location.

Currently, memory devices typically are configured to follow one of two approaches for enabling the memory array: enabling during a rising edge of the CLK signal or enabling during a falling edge of the CLK signal. For both approaches, the memory device is configured to use the received CLK signal to enable activation of the specified memory location. These two conventional approaches are described below in reference to FIGS. 1B.

FIG. 1B represents typical timing diagrams for CLK and ADR signals (ADR$_1$ through ADR$_n$), which are provided to the memory device 100 of FIG. 1A. As described above, the memory device 100 is enabled either during the rising edge 102 or the falling edge 104 of the CLK signal. When the memory device 100 is enabled (e.g., during transition 102 or 104), the specified memory location is then activated and data is read from or written to the specified memory location within the memory array.

Although these two conventional enabling approaches work well under certain conditions, both approaches have associated disadvantages. When the memory device is enabled at the CLK signal's rising edge 104, all or some of the ADR signals may have failed to completely transition to their new address values before the specified memory location is activated. The ADR signals typically begin to transition from a first value to a second value at the rising edge of the CLK signal. However, some of the ADR signals take a significantly longer time to transition than other address signals. As shown, the transition times for ADR$_1$, ADR$_2$, and ADR$_n$ are d$_1$, d$_2$, and d$_n$, respectively. Note, transition time dn is significantly longer than transition time d$_1$. Thus, if the memory device is enabled at the rising edge 102 of the CLK signal, it is likely that some of the ADR signals have not transitioned when the memory device is then activated. Thus, data may then be read from or written to an erroneous memory location within the memory device.

Another conventional approach is to enable the memory device at the falling edge 104 of the CLK signal. Although this approach gives the ADR signals enough time to transition, this approach may not provide enough time to decode the ADR signals, activate the memory device and perform a read or a write operation. In other words, the ADR signals may begin to transition to a new value (e.g., at the CLK signal's next rising edge 106) before the read or write operation is finished, and the possibility of an erroneous read or write is thereby increased. For memory device designs that take longer than a half cycle of the CLK signal to perform a read or a write operation, this enabling approach may be inadequate.

In view of the foregoing, there is a need for an enabling mechanism and technique that provides adequate time for the ADR signals to transition to stable values, while providing enough time for the memory device to be activated and perform a read or a write operation after the ADR signals stabilize and before the ADR signals transition to new values.

SUMMARY OF THE INVENTION

Accordingly, the present invention provides an apparatus and method for activating a memory location within a memory device. In general terms, the present invention provides a system and method for generating a delayed enable signal within a memory device based on a received clock signal. That is, the memory device of the present invention receives the clock signal and delays the clock signal to create an enable signal for activating the memory device. The enable signal is delayed from the clock signal by at least about a worst case delay of a plurality of address signals that are also input into the memory device. As a result, a particular memory location of the memory device is not activated until all of the address signals have transitioned to stable values.

In an apparatus aspect of the invention, a memory device is disclosed. The memory device includes an enable unit arranged to receive a plurality of address signals and a clock signal and to output an activation signal. The address signals have an associated worst case delay, and the enable unit is further arranged to generate an enable signal that is delayed from the clock signal by at least about the worst case delay. The memory device further includes a memory array arranged to receive the activation signal in response to which a corresponding memory location is activated.

In one embodiment, the enable unit is arranged to generate the enable signal to substantially directly control activation of the corresponding memory location. According to this embodiment, the enable unit includes (i) a decoder unit arranged to receive the address signals and to output a preactivation signal associated with the corresponding memory location, (ii) a delay unit arranged to receive the clock signal and generate the enable signal, and (iii) a plurality of multiplexers. A selected one of the multiplexers is arranged to receive the preactivation signal and the enable signal and to output an activation signal in response to the preactivation signal and the enable signal to the corresponding memory location.

In an alternative embodiment, the enable unit is arranged to generate the enable signal to control when the address signals are decoded and the corresponding memory location is activated. The enable unit includes (i) a delay unit arranged to receive the clock signal and to output the enable signal that is delayed from the clock signal by at least about the delay time and (ii) a decoder unit arranged to receive the address signals and the enable signal from the delay unit and to output the activation signal that corresponds to the memory location in response to the address signals and the enable signal.

In another apparatus of the invention, a memory device is disclosed that includes a memory array comprising a plurality of memory locations, an address register for storing a memory address corresponding to one of the memory locations, and a decoder for receiving a plurality of address signals representing the memory address from the address register and, upon activation by an enable signal, selecting the corresponding memory location. The memory device also includes an address bus between the address register and the decoder for transmitting the address signals to the decoder. The address bus has a worst case delay associated therewith. The memory device further includes a clock line for transmitting a clock signal in the memory device and delay circuitry coupled to the clock line and the decoder for delaying the clock signal by at least about the worst case delay, thereby generating the enable signal.

In yet another apparatus aspect, in a memory device comprising a clock line for transmitting a clock signal, and a decoder for receiving a plurality of address signals transmitted via an address bus and, upon activation by an enable signal, selecting a corresponding memory location, enable circuitry is disclosed. The enable circuitry includes delay circuitry coupled to the clock line and the decoder for delaying the clock signal by at least about a worst case delay, thereby generating the enable signal. The worst case delay is associated with the address bus.

In a method aspect, a method for selecting a memory location in a memory array is disclosed. In response to a first transition of a clock signal, a plurality of address signals corresponding to the memory location are transmitted from an address register to a decoder. A worst case delay is associated with the address signals. The clock signal is delayed by at least about the worst case delay, thereby generating an enable signal. The memory location is selected in response to a first transition of the enable signal. The first transition of the enable signal corresponds to the first transition of the clock signal.

The present invention has many advantages. For example, by generating an enable signal that is delayed from the clock signal by at least about a worst case delay of the address signals, the address signals that are input into the memory device will likely have stable values by the time the memory device is activated by the enable signal. That is, the address signals are less likely to have ambiguous or erroneous values as a result of the address signals failing to transition completely to new address values.

Additionally, the memory device of the present invention may utilize a significant portion of the clock cycle to decode the address signals, activate a memory location, and complete a read or a write operation since the memory device is enabled from a first transition of the enable signal that is delayed from a first rising edge of the clock signal to a second transition of the enable signal that is delayed from a second rising edge of the clock signal. Thus, the memory device may be designed with more relaxed timing specifications than a conventional memory device that utilizes the falling edge of the clock signal as an enable signal thereby allowing only a half cycle of the clock signal to decode the address signals and access the memory location.

Also, various fabrication processes may be used to manufacture the memory device without affecting the reliability of the memory device's enablement function when the enable signal includes a margin delay in addition to the worst case delay of the address signals. As a result of this increased reliability among various fabrication processes, a new simulation of the worst case ADR signal delay is not required for each new fabrication change. For example, when a 0.5 $\mu$m process is upgraded to a 0.4 $\mu$m process, a new simulation is not required for the new 0.4 $\mu$m process.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1A:
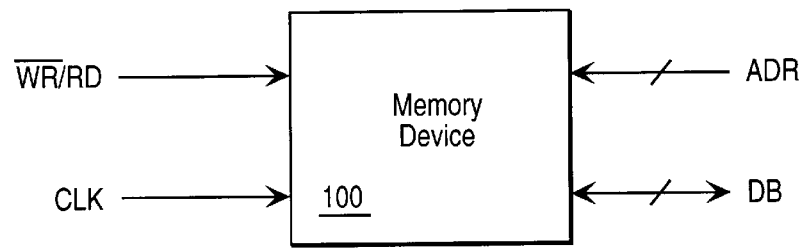
FIG. 1A is a diagrammatic representation of a conventional memory device.
Figure 1B:
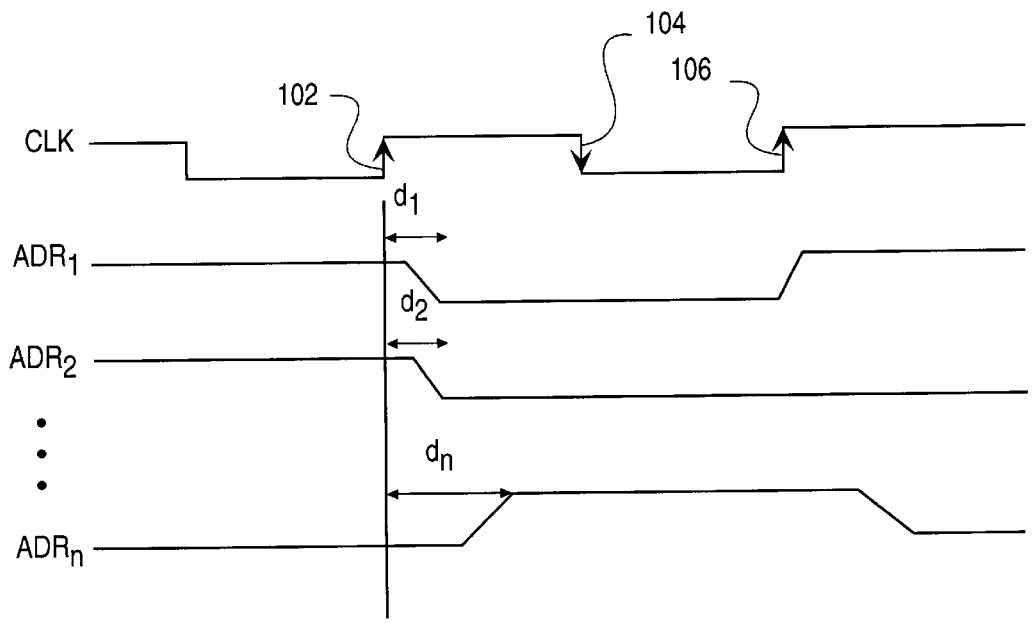
FIG. 1B represents typical timing diagrams for clock and address signals ($ADR_1$ through $ADR_n$), which are provided to the memory device of FIG. 1A.
Figure 2A:
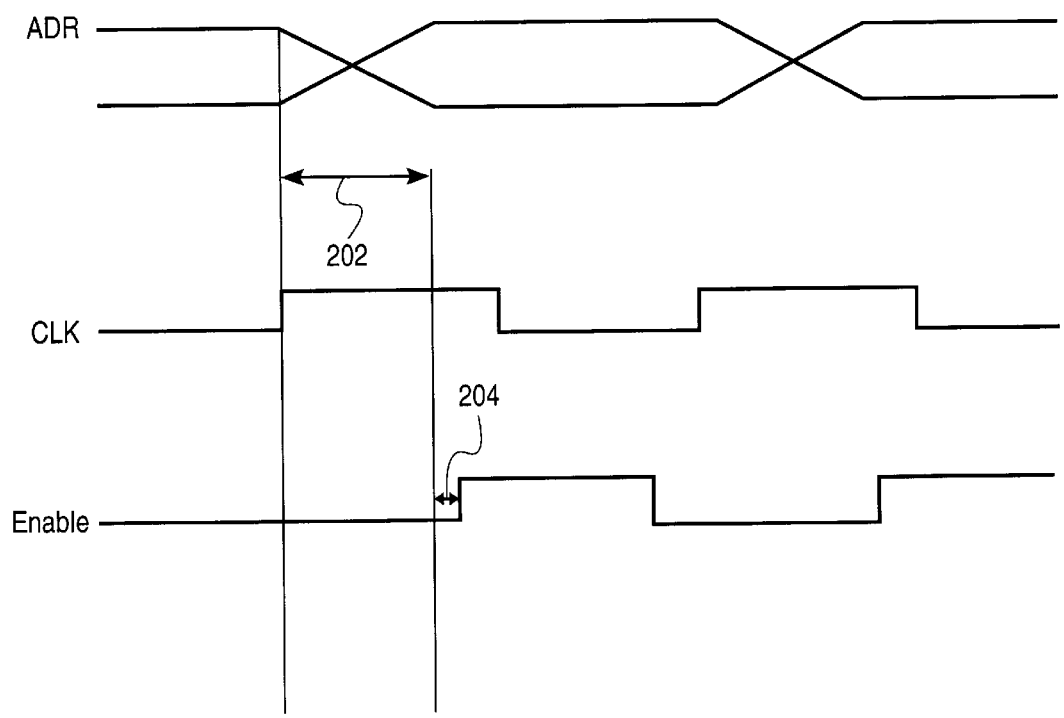
FIG. 2A represents timing diagrams for address signals and clock signal that are input into a memory device of the present invention and a delayed enable signal that is generated from the clock signal by the memory device in accordance with one embodiment of the present invention.

FIG. 2A represents timing diagrams for address (ADR) signals and clock (CLK) signal that are input into a memory device of the present invention and a delayed enable signal that is generated from the CLK signal by the memory device in accordance with one embodiment of the present invention. As shown, the ADR signals transition to a new value during time period 202. Time period 202 represents the worst case delay for a last ADR signal to transition to a new value. One of the reasons that the ADR signals have different transition times is that each ADR signal is transmitted along differently sized routing paths. In one embodiment of the present invention, which embodiment is described further below, this relationship between the routing and worst case delay of the ADR signals is utilized to generate the enable signal.

In the present invention, the enable signal is generated by delaying the CLK signal by at least about the worst case ADR signal delay (202). By delaying the enable signal by at least about the worst case ADR signal delay, the ADR signals will likely have enough time to transition to stable new values before the memory device is enabled. In other words, when data is read from or written into a particular memory location of the memory device, it is more likely that the memory location is correct than with conventional memory devices that use the CLK signal's rising edge to activate the memory location, wherein all of the ADR signals have likely not yet transitioned to new values.

To compensate for fabrication deviations and semiconductor process changes, the enable signal may be further delayed from the CLK signal by a margin 204. Any suitable value may be selected for the margin 204 to ensure that the memory device is not activated before the ADR signals transition to their respective new values. For example, the margin may be selected to be about 5 to 10 percent of the total CLK signal cycle. This range appears to provide enough time for ADR signals to transition within a wide range of memory devices that were fabricated under various semiconductor process conditions.

Figure 2B:
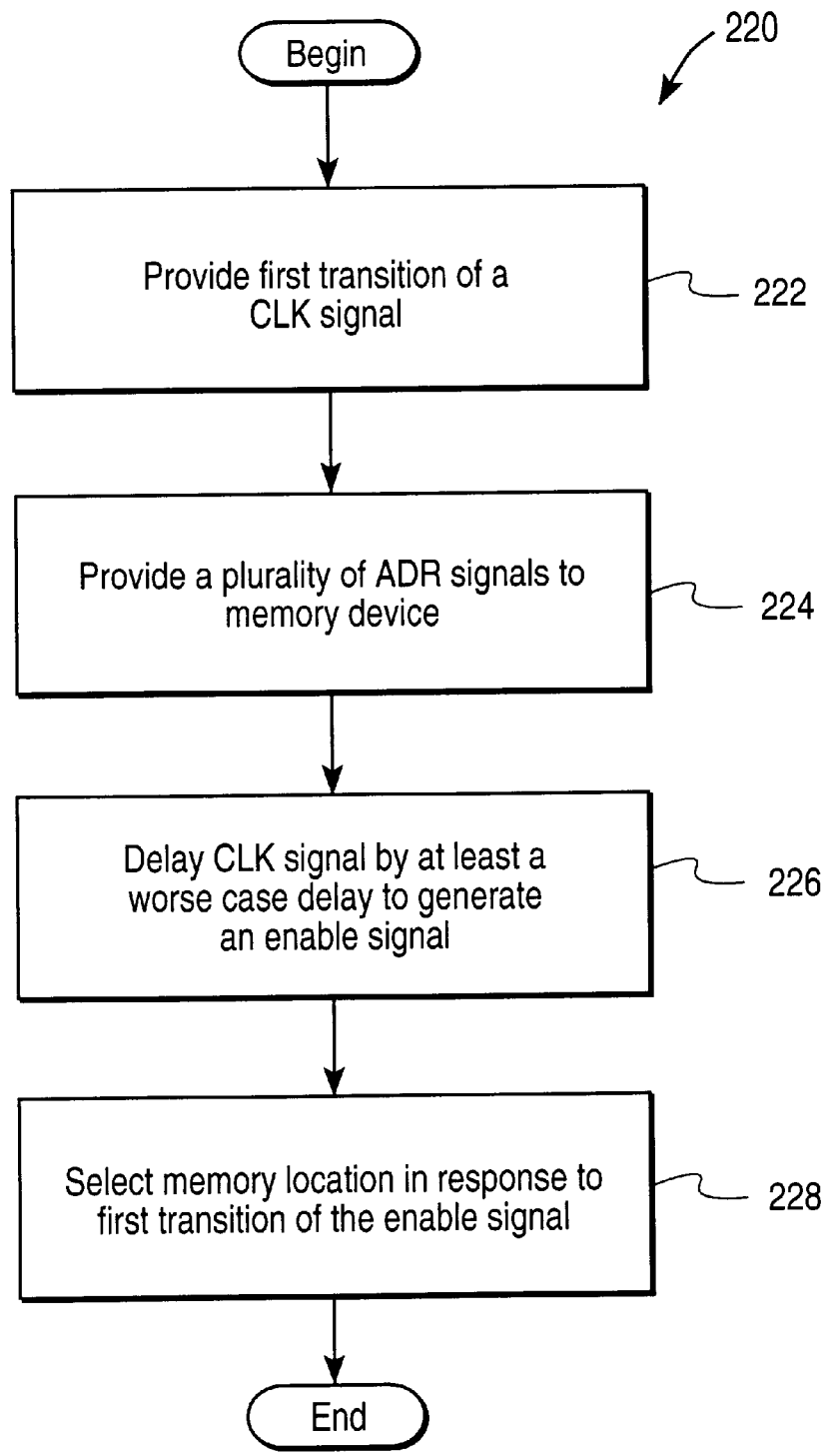
FIG. 2B is a flowchart illustrating a process of selecting or activating a memory location in a memory device in accordance with one embodiment of the present invention.

FIG. 2B is a flowchart illustrating a process 220 of selecting or activating a memory location in a memory device in accordance with one embodiment of the present invention. Initially, in operation 222, a first transition of a CLK signal is provided to the memory device. Any suitable transition of the CLK signal may be used for the first transition that corresponds to when the ADR signals begin to transition. Typically, the ADR signals will begin to transition during the rising edge of the CLK signal; thus, the first transition is usually in the form of a rising edge of the CLK signal.

After the first transition of the CLK signal is provided to the memory device, a plurality of ADR signals are then provided to the memory device in operation 224. Alternatively, the ADR signals may be provided prior to providing the CLK signals. The CLK signal is delayed by at least about a worst case delay of the transmitted ADR signals to generate the enable signal in operation 226. In operation 228, the memory location that corresponds to the transmitted ADR signals is then selected in response to a first transition of the generated enable signal that is delayed from the first transition of the CLK signal.

Any suitable system may be used to implement the process 220 of FIG. 2A. For example, an enable unit may be configured to generate the enable signal to control the decoding of the ADR signals. That is, in response to the enable signal, the ADR signals are decoded and a memory location is selected and activated. By way of another example, the enable unit may be configured to generate the enable signal to more substantially directly control activation of the memory location. That is, after the ADR signals are decoded based on the decoded ADR signals, the memory location is then selected or activated in response to the enable signal.

Figure 3:
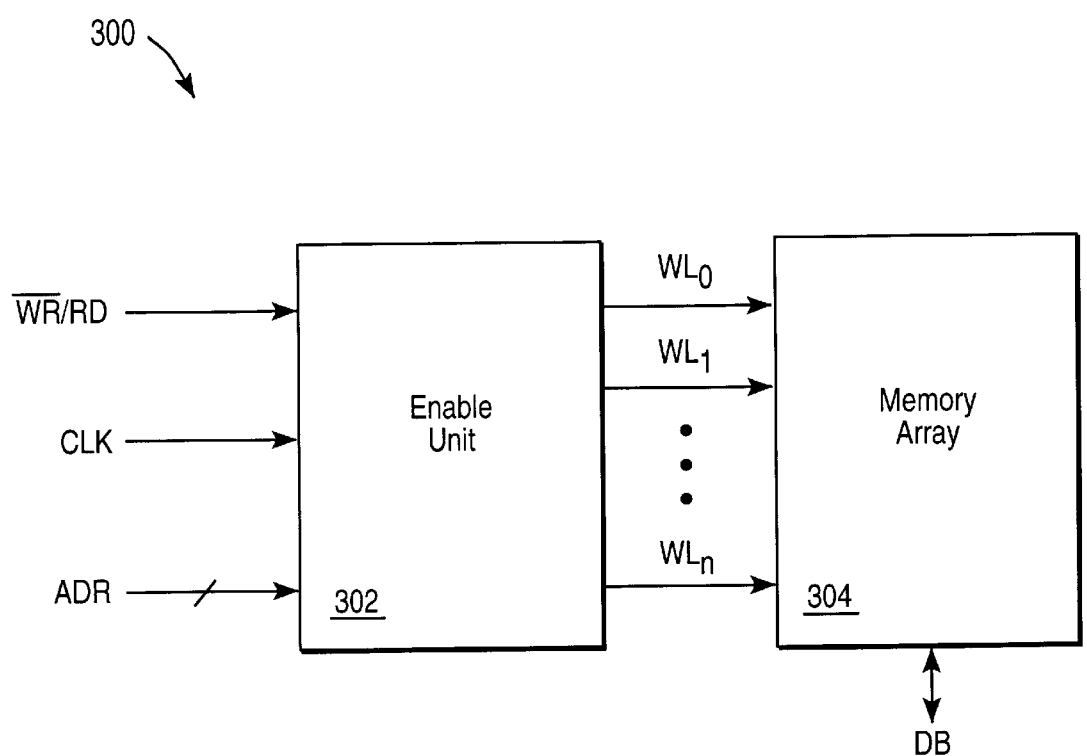
FIG. 3 is a diagrammatic representation of a memory device that is suitable for implementing the process of FIG. 2B of selecting a memory location of the memory device.

FIG. 3 is a diagrammatic representation of a memory device 300 that is suitable for implementing the process 220 of FIG. 2B of selecting a memory location of the memory device. Certain ones of the blocks of the memory device 300 may be implemented with discrete circuit elements, or as software routines executed by a suitable digital processor, such as a high speed signal processor. Alternatively, a combination of circuit elements and software routines may be employed. As such, the ensuing description is not intended to limit the application of this invention to any one particular technical embodiment.

As shown, the memory device 300 includes an enable unit 302 and a memory array 304. The enable unit 302 is configured to receive a plurality of ADR signals, a CLK signal, and a WR!/RD signal. Each set of received ADR signals represent a selected memory location within the memory array. The CLK signal is used to generate an enable signal (not shown) that is, in turn, used to activate the selected memory location. A WR!/RD signal may also be utilized to indicate whether data is to be read from or written to the selected memory location. In response to the received signals, the enable unit 302 selects or activates the selected memory location by outputting an activation signal on a selected one of a plurality of activation lines ($WL_0$ through $WL_n$) that is coupled to the selected memory location.

The enable unit 302 is arranged to internally generate the enable signal (not shown) based on the CLK signal. As described above, the enable signal is delayed from the CLK signal by at least about a worst case delay of the ADR signals. In response to the enable signal, the enable unit is also arranged to activate the selected memory location that corresponds to the received ADR signals.

The enable unit 302 activates the selected memory location during a rising edge of the enable signal, which is delayed from a rising edge of the CLK signal by at least about the worst case delay of the ADR signals. The worst case delay may include the worst case delay for all of the ADR signals to reach the enable unit 302, as well as the time it takes for the ADR signals to be received and amplified by the enable unit 302.

The enable unit 302 may be configured to further delay the enable signal from the CLK signal by an extra margin so as to decrease the likelihood of activating the memory location when the enable signal's delay from the CLK signal does not exactly match the actual worst case delay of the ADR signals. Embodiments of the enable unit are further described below in reference to FIGS. 4A, 4B, and 5.

Figure 4A:
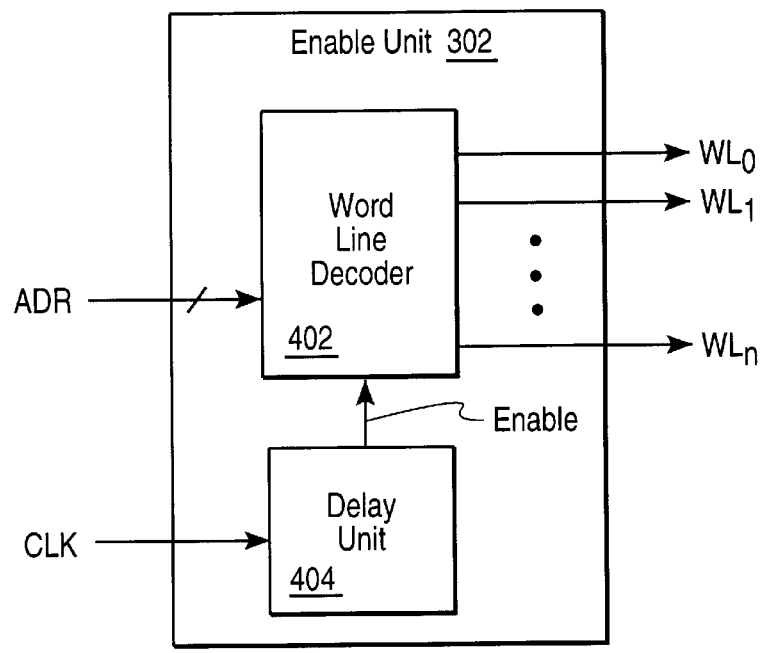
FIG. 4A is a diagrammatic representation of a first implementation of the enable unit of FIG. 3 in accordance with one embodiment of the current invention.

FIG. 4A is a diagrammatic representation of a first implementation 302 of the enable unit of FIG. 3 in accordance with one embodiment of the current invention. As shown, the enable unit 302 includes a word line decoder 402 configured to decode the received ADR signals and a delay unit 404 configured to generate the enable signal based on the received CLK signal.

The delay unit 404 is arranged to receive and delay the CLK signal by at least about the worst case delay of the ADR signals. The delayed CLK signal is output to the word line decoder 402 as the enable signal. The word line decoder 402 is arranged to receive the enable signal from the delay unit 404 and the ADR signals and to activate one of a plurality of activation lines ($WL_0$ through $WL_n$) based on the received ADR signals and enable signal. The selected activation line is associated with a row of the memory array. Thus, the word line decoder is arranged to activate a selected row of the memory array.

Additionally, a bit line decoder (not shown) may be employed to activate a pair of complementary bit lines (not shown) that are associated with a particular column of memory locations within the memory array. The word line decoder and bitline decoder work together to activate the selected memory location, which is located at the intersection of the activated row and column of the memory array. Although the present invention is described as being implemented within a word line decoder, it may also be implemented with any suitable ADR decoder, such as a bitline decoder.

Figure 4B:
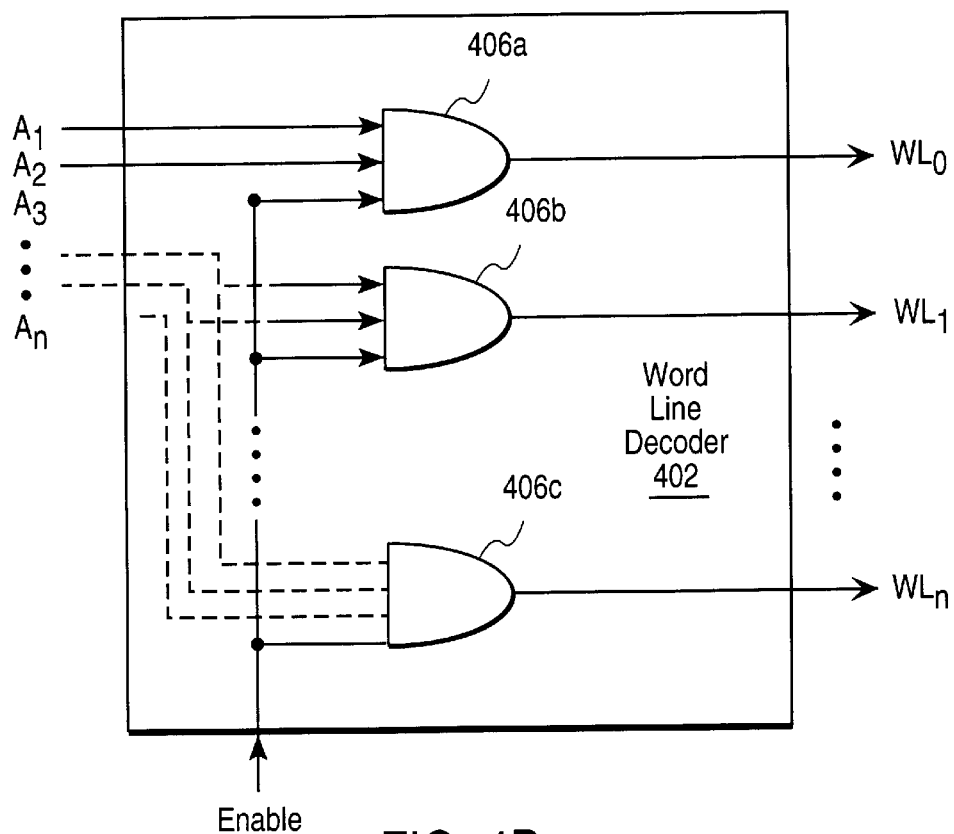
FIG. 4B is a diagrammatic representation of the word line decoder of the enable unit of FIG. 4A in accordance with one embodiment of the current invention.

As described above, the word line decoder 402 is configured to activate a memory location of the memory array 304 (see FIG. 3) through one of the activation lines ($WL_0$ through $WL_n$) in response to the delayed enable signal. FIG. 4B is a diagrammatic representation of the word line decoder 402 of the enable unit 302 of FIG. 4A in accordance with one embodiment of the current invention.

As shown, the decoder 402 includes a plurality of AND gates 406 that are configured to receive selected ADR signals and output a corresponding activation signal on one of activation lines $WL_0$ through $WL_n$ that is associated with the ADR signals. Of course, each AND gate may be replaced by an equivalent multiplexer arrangement, such as a NAND gate and an inverter. The associated activation line is not selected or activated until the enable signal transitions to an enable state (e.g., a logical "1" or high voltage state). In other words, a selected one of the AND gates outputs the activation signal on one of the activation lines $WL_0$ through $WL_n$ when the selected AND gate's selected ADR signals and enable signal input are equal to "1".

Figure 4C:
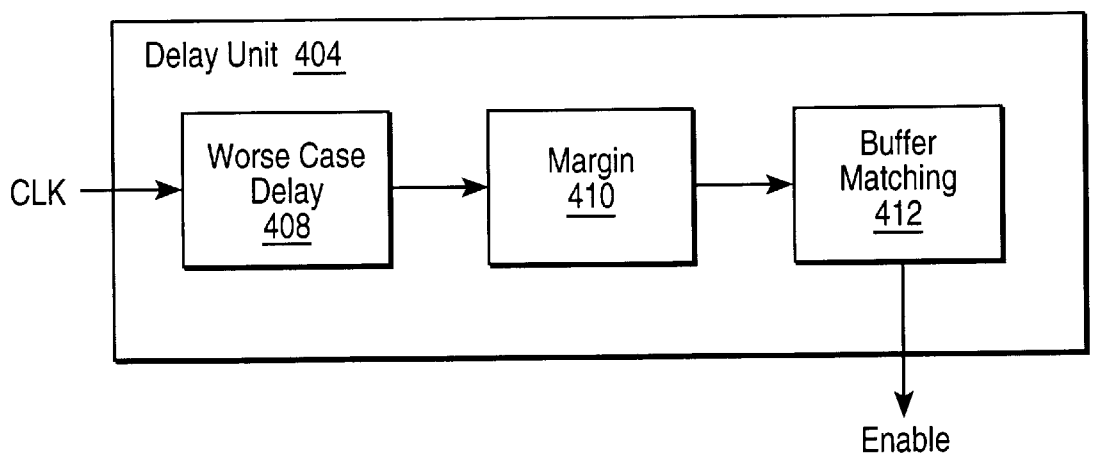
FIG. 4C is a diagrammatic representation of the delay unit of the enable unit of FIG. 4A (and of the enable unit of FIG. 5, which is described below,) in accordance with one embodiment of the current invention.

FIG. 4C is a diagrammatic representation of the delay unit 404 of the enable unit 302 of FIG. 4A (and of the enable unit 302' of FIG. 5, which is described below,) in accordance with one embodiment of the current invention. As shown, the delay unit 404 includes a worst case delay unit 408 for delaying the CLK signal by at least about a worst case delay of the ADR signals.

The delay unit 404 may be implemented in any suitable manner so as to delay the CLK by at least about the worst case delay of the ADR signals. For example, the routing path that is used to transmit the worst case ADR signal may be duplicated within the delay unit 404 to mimic the worst case delay. That is, the CLK signal is transmitted through a duplicated routing path in the delay unit to produce the enable signal. By way of another example, the RC delay for the worst case delay ADR signal may be calculated and a corresponding capacitor and/or resistor structure may be implemented that has the same RC delay. The CLK signal is then transmitted through the capacitor and/or resistor structure to generate the enable signal. Additionally, the delay unit may be formed from a single device or a plurality of devices (such as an even number of chained inverters), wherein the CLK signal is transmitted through device(s) having the same RC delay as the worst case delay of the ADR signals.

The delay unit 404 may also include a margin unit 410 for providing an extra delay time and increasing the reliability of memory devices that are manufactured under various fabrication conditions, for example. By way of a more specific example, a memory device that is manufactured with a 0.5 μm process will function differently than a memory device manufactured with a 0.4 μm process. Specifically, the delay of the enable signal may not precisely match the worst case delay of the ADR signals. Thus, the margin unit 410 may be implemented in any suitable configuration that leaves enough time to compensate for this mismatch. Any suitable value may be used for the margin so as to increase reliability of the memory device. For example, a margin value of about 5 to 20 percent of the CLK cycle may work well, and, preferably about 5 to 10 percent.

The delay unit 404 may also include a buffer matching unit 412 for matching the ADR signal delay through the enable unit's input buffers (e.g., input buffers 306). That is, the time taken by the enable unit's input buffers to receive and amplify the ADR signals is added to the delay of the enable signal relative to the CLK signal. The buffer matching unit 412 may be implemented by duplicating the input buffer's sizing, shape, and routing such that the buffer matching unit 412 has the same performance as the actual input buffers, even under variable conditions, such as changes in process and temperature.

Figure 5:
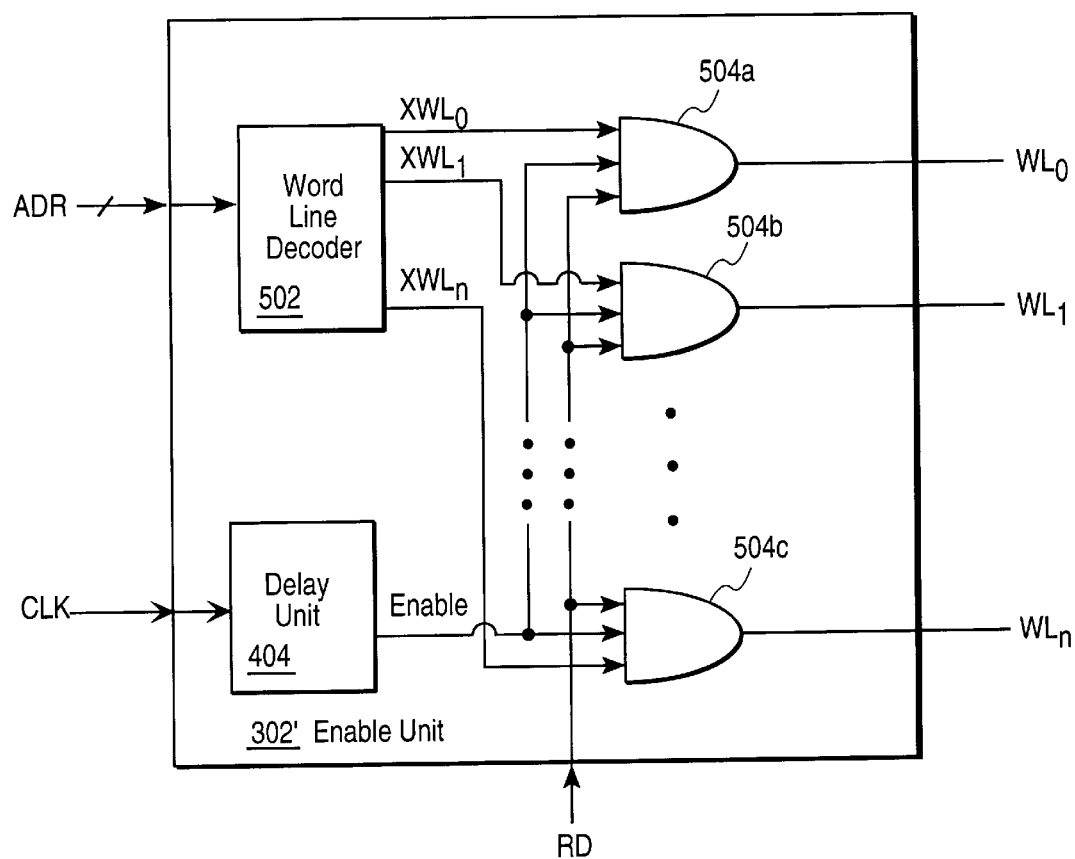
FIG. 5 is a diagrammatic representation of a second implementation of the enable unit of FIG. 3 in accordance with an alternative embodiment of the current invention.

FIG. 5 is a diagrammatic representation of a second implementation 302' of the enable unit of FIG. 3 in accordance with an alternative embodiment of the current invention. As shown in this second implementation, the enable unit 302' includes a word line decoder 502 configured to receive ADR signals and output a preactivation signal on one of a plurality of preactivation lines ($XWL_0$ through $XWL_n$) based on the ADR signals. More specifically, one of the preactivation lines that is associated with the ADR signals is activated and output to one of a plurality of AND gates 504.

The enable unit 302' also includes the delay unit 404 that was described above in reference to FIG. 4C. The delay unit 404 is arranged to receive the CLK signal and generate the enable signal by delaying the CLK signal by at least about the worst case delay of the ADR signals. The delay unit 404 is further arranged to output the enable signal to each of the plurality of AND gates 504.

Each of the plurality of AND gates 504 are configured to receive one of the preactivation lines from the word line decoder 502, the enable signal from the delay unit 404, as well as a RD! enable signal (the RD! signal is set high for a write). As shown, each of the AND gates 504 is configured to output an activation signal to an associated one of the activation lines ($WL_0$ through $WL_n$) when the received preactivation signal, enable signal, and RD! signal indicate that the corresponding memory location is to be activated. For example, the AND gate 504a transmits the activation signal along $WL_0$ when the preactivation signal $XWL_0$, the enable signal, and the RD! each have a logical "1" value.

Although the present invention is described in terms of enabling a write operation to the memory array, it may also be implemented for a read operation. Additionally, any suitable multiplexing devices may be used in place of the plurality of AND gates 504.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. For example, the enable signal may be delayed from the CLK signal by an amount that is significantly lower or higher than the worst case delay of the ADR signals. If the amount is lower, then the enable signal may also be delayed by a margin delay that compensates for the difference between the worst case delay and the enable delay. Accordingly, the present embodiments are to be considered as illustrative and not restrictive, and the invention is not to be limited to the details given herein, but may be modified within the scope and equivalents of the appended claims.

What is claimed is:

1. A memory device comprising:
    an enable unit arranged to receive a plurality of address signals and a clock signal and to output an activation signal, at least one of the address signals being characterized by a worst case delay relative to a first transition of the clock signal, the enable unit being further arranged to generate an enable signal which follows the first transition of the clock signal by at least about the worst case delay and which occurs before a next transition of the clock signal, the enable signal being for controlling the activation signal; and a memory array arranged to receive the activation signal such that a memory location corresponding to the activation signal is activated.

2. A memory device as recited in claim 1, wherein the enable unit is arranged to generate the enable signal to substantially directly control activation of the corresponding memory location.

3. A memory device as recited in claim 2, wherein the enable unit comprises:

a decoder unit arranged to receive the address signals and to output a preactivation signal associated with the corresponding memory location;

a delay unit arranged to receive the clock signal and generate the enable signal; and a plurality of multiplexers, wherein a selected one of the multiplexers is arranged to receive the preactivation signal and the enable signal and to output an activation signal in response to the preactivation signal and the enable signal to the corresponding memory location.

4. A memory device as recited in claim 1, wherein the enable unit is arranged to generate the enable signal to control when the address signals are decoded and the corresponding memory location is activated.

5. A memory device as recited in claim 4, wherein the enable unit comprises:

a delay unit arranged to receive the clock signal and to output the enable signal which follows the first transition of the clock signal by at least about the worst case delay and which occurs before the next transition of the clock signal; and a decoder unit arranged to receive the address signals and the enable signal from the delay unit and to output the activation signal that corresponds to the memory location in response to the address signals and the enable signal.

6. A memory device as recited in claim 1, wherein the enable unit is further configured to delay the enable signal from the clock signal by a margin that is selected to increase reliability of the memory device.

7. A memory device as recited in claim 1, wherein the enable unit is further configured to delay the enable signal from the clock signal by a margin that is between about 5 and 20 percent of a cycle of the clock signal.

8. A memory device as recited in claim 7, wherein the margin is between about 5 and 10 percent of a cycle of the clock signal.

9. A memory device as recited in claim 1, wherein the enable unit includes a plurality of input buffers, each input buffer being arranged to amplify an associated address signal, and the enable unit is configured to further delay the enable signal from the clock signal by a buffer matching time that has a duration substantially equal to an amplification time of one of the input buffers.

10. A memory device as recited in claim 9, the enable unit further includes a buffer matching unit duplicating the input buffer's sizing, shape, and routing such that the buffer matching unit has a same performance as the input buffers, even under variable conditions, such as changes in process and temperature.

11. A memory device as recited in claim 1, wherein the first transition of the clock signal is in the form of a rising edge.

12. A memory device comprising: a memory array comprising a plurality of memory locations;

an address register for storing a memory address corresponding to one of the memory locations;

a decoder for receiving a plurality of address signals representing the memory address from the address register and, upon activation by an enable signal, selecting the corresponding memory location;

an address bus between the address register and the decoder for transmitting the address signals to the decoder, the address bus having an address signal that is characterized by worst case delay;

a clock line for transmitting a clock signal in the memory device; and delay circuitry coupled to the clock line and the decoder for generating the enable signal such that it follows a first transition of the clock signal by at least about the worst case delay and occurs before a next transition of the clock signal.

13. In a memory device having a clock line for transmitting a clock signal, and a decoder for receiving a plurality of address signals transmitted via an address bus and, upon activation by an enable signal, selecting a corresponding memory location, enable circuitry comprising delay circuitry coupled to the clock line and the decoder for generating the enable signal such that it follows a first transition of the clock signal by at least about a worst case delay of a selected one of the address signals but occurs prior to a next transition of the clock signal, thereby generating the enable signal.

14. A memory device as recited in claim 13, wherein the delay circuitry duplicates a routing path of a worst case address signal of the plurality of address signals associated with the worst case delay of the address signals.

15. A memory device as recited in claim 13, wherein the delay circuitry is a structure being selected from the group consisting of a capacitor structure, a resistor structure, a plurality of discrete devices, and a single device.

16. A method for selecting a memory location in a memory array, comprising:

in response to a first transition of a clock signal, transmitting a plurality of address signals corresponding to the memory location from an address register to a decoder, a selected one of the address signals being characterized by a worst case delay;

generating an enable signal that follows the first transition of the clock signal by at least about the worst case delay but occurs before a second transition of the clock signal that follows the first transition of the clock signal; and selecting the memory location in response to a first transition of the enable signal, the first transition of the enable signal corresponding to the first transition of the clock signal.

17. A method as recited in claim 16, wherein the address signals begin to transition at the first transition of the clock signal.

18. A method as recited in claim 17, wherein the first transition of the clock signal is a rising edge.

19. A method as recited in claim 16 further comprising delaying the clock signal by a margin delay that is between about 5 and 10 percent of a clock cycle of the clock signal.

20. A method as recited in claim 16, further comprising decoding the address signals in response to the enable signal.

21. A method as recited in claim 18, wherein the memory location is selected until a next transition of the enable signal corresponding to a next rising edge of the clock signal.

* * * * *